(12) United States Patent
Chang et al.

(10) Patent No.: US 8,377,815 B2
(45) Date of Patent: Feb. 19, 2013

(54) MANUFACTURING METHOD OF A SEMICONDUCTOR LOAD BOARD

(75) Inventors: Chien-Wei Chang, Taoyuan (TW); Ting-Hao Lin, Taipei (TW); Ya-Hsiang Chen, Yulin (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 47 days.

(21) Appl. No.: 13/043,463

(22) Filed: Mar. 9, 2011

(65) Prior Publication Data

US 2012/0231621 A1    Sep. 13, 2012

(51) Int. Cl.
*H01L 21/44* (2006.01)

(52) U.S. Cl. ........ 438/612; 438/613; 257/738; 257/786; 257/E21.508; 257/E23.02; 257/E23.021

(58) Field of Classification Search .................. 438/613, 438/612; 257/738, E21.508, E23.021, 786, 257/E23.02
See application file for complete search history.

(56) References Cited

U.S. PATENT DOCUMENTS 5,872,404 A * 2/1999 Lynch et al. .................. 257/781

* cited by examiner

*Primary Examiner* — Mary Wilczewski
*Assistant Examiner* — Toniae Thomas
(74) *Attorney, Agent, or Firm* — Lin & Associates IP, Inc.

(57) ABSTRACT

A manufacturing method of a semiconductor load board is disclosed. The manufacturing method includes a first conductive layer forming step, a first patterning step, a dielectric layer forming step, a drilling step, a second conductive layer forming step, a second patterning step or a two-times patterning step, and a solder connecting step. In a second patterning step or a two-times patterning step, a solder pad is formed in the opening of the dielectric layer, wherein each solder pad has a height higher than the height of the dielectric, and the width of each solder pad is equal to or smaller than the maximum width of the opening, such that wider intervals are provided in the same area and the problems of short circuit failure and electrical interference can be reduced.

12 Claims, 10 Drawing Sheets

MANUFACTURING METHOD OF A SEMICONDUCTOR LOAD BOARD

BACKGROUND OF THE INVENTION

1. Field of the Invention

The present invention relates to a manufacturing method of a semiconductor load board, and more particularly, to a manufacturing method of a semiconductor load board on which the width of the solder pads formed is smaller than or equal to the width of the opening of the dielectric layer formed.

2. The Prior Arts

FIG. 1 illustrates the cross sectional view of the semiconductor load board in prior arts. As shown in FIG. 1, the semiconductor load board 1 comprises a substrate 10, a plurality of connection pads 22, a patterned circuit layer 24, a dielectric layer 30, a plurality of solder pads 48, and a plurality of solders 58. The substrate 10 is made of polymer materials or ceramic materials, and the polymer materials comprise Bismaleimide Triazine (BT). The connection pads 22 and the patterned circuit layer 24 are located on the substrate 10, and are formed using a first conductive material comprising copper. The dielectric layer 30 is formed on the connection pads 22 and the patterned circuit layer 24, and has a plurality of openings 35 corresponding to the plurality of connection pads 22, wherein the openings 35 have a width reduced gradually toward the connection pads 22, and the minimum width is D1, and the maximum width is D2. The solder pads 48 are formed in the openings 35 corresponding to the connection pads 22 to fill up the openings 35. The solder pads 48 have a height higher than the height of the dielectric layer 30, and the width D6 of a portion higher than the dielectric layer 30 is wider than the maximum width D2 of the openings 35. The solder pads 48 are formed by a second conductive material which is copper or copper with nickel-gold or tin coating. The solders 58 are formed on each solder pad 48 respectively to cover the solder pad 48 for connecting to external circuits (not shown).

While the technology develops, the number of the chips loaded on the same semiconductor load board increases. The structure of the prior arts has a problem that the solder pads are too close to each other, and makes short-circuit failure and electrical interference more likely to occur. Therefore, a load board structure that can reduce the problems of the short-circuit failure and electrical interference, and the manufacturing method thereof is needed.

SUMMARY OF THE INVENTION

A primary objective of the present invention is to provide a manufacturing method of a semiconductor load board. The method comprises the steps of: coating a first conductive material on a substrate to form a first conductive layer; forming a first photoresist on the first conductive layer, exposing the first photoresist to light using a first pattern photomask, developing the exposed first photoresist to form a first photoresist pattern on the first conductive layer, etching the exposed portions of the first conductive layer, removing the first photoresist pattern to form a plurality of connecting pads and a patterned circuit layer; forming a dielectric layer on the substrate, the connection pads and the patterned circuit layer; forming a plurality of openings at the positions of the dielectric layer corresponding to the connection pads by using an alignment laser micro-drilling method, wherein the opening has a width reduced gradually toward the connection pads; forming a second conductive layer on the dielectric layer and filling the openings; forming a second photoresist on the second conductive layer, exposing the second photoresist to light using a second pattern photomask, developing the exposed second photoresist to form a second photoresist pattern having a width equal to a maximum width of the openings on the second conductive layer, etching the exposed portions of the second conductive layer, removing the second photoresist pattern to form a plurality of solder pads, wherein each solder pad has a height higher than a height of the dielectric layer, and a width of a portion of each solder pad, which is higher than the dielectric layer, equals to the maximum width of the opening; and forming solders on the solder pads.

Another objective of the present invention is to provide a manufacturing method of a semiconductor load board. The method comprises the steps of: coating a first conductive material on a substrate and forming a first conductive layer; forming a first photoresist on the first conductive layer, exposing the first photoresist to light using a first pattern photomask, developing the exposed first photoresist to form a first photoresist pattern on the first conductive layer, etching the exposed portions of the first conductive layer, removing the first photoresist pattern to form a plurality of connecting pads and a patterned circuit layer; forming a dielectric layer on the substrate, the connection pads and the patterned circuit layer; forming a plurality of openings at the positions of the dielectric layer corresponding to the connection pads by using an alignment laser micro-drilling method, wherein the opening has a width reduced gradually toward the connection pads; forming a second conductive layer on the dielectric layer and filling the openings; forming a second photoresist on the second conductive layer, exposing the second photoresist to light using a second pattern photomask, developing the exposed second photoresist to form a second photoresist pattern having a width equal to a maximum width of the openings on the second conductive layer, etching the exposed portions of the second conductive layer, removing the second photoresist pattern to form a plurality of solder pads; forming a third photoresist on the solder pads, exposing the third photoresist to light using a third pattern photomask, developing the exposed third photoresist to form a third photoresist pattern having a width smaller than a maximum width of the openings on the solder pads, etching the exposed portions of the solder pads, removing the third photoresist pattern to form a plurality of etched solder pads, each of the etched solder pads having a protrusion portion which extends above the surface of the dielectric layer, the protrusion portion having a width smaller than the maximum width of the opening; and forming the solders on the etched solder pads.

Also another objective of the present invention is to provide a manufacturing method of a semiconductor load board. The method comprises the steps of: coating a first conductive material on a substrate to form a first conductive layer; forming a first photoresist on the first conductive layer, exposing the first photoresist to light using a first pattern photomask, developing the exposed first photoresist to form a first photoresist pattern on the first conductive layer, etching the exposed portions of the first conductive layer, removing the first photoresist pattern to form a plurality of connecting pads and a patterned circuit layer; forming a dielectric layer on the substrate, the connection pads and the patterned circuit layer; forming a plurality of openings at the positions of the dielectric layer corresponding to the connection pads by using an alignment laser micro-drilling method, wherein the opening has a width reduced gradually toward the connection pads; forming a second conductive layer on the dielectric layer and filling the openings; forming a second photoresist on the second conductive layer, exposing the second photoresist to light using a second pattern photomask, developing the exposed second photoresist to form a second photoresist pattern having a width equal to a minimum width of the openings on the second conductive layer, etching the exposed portions of the second conductive layer, removing the second photoresist pattern to form a plurality of solder pads, wherein each solder pad has a height higher than a height of the dielectric layer, and the width of each solder pad is smaller than the minimum width of the opening; and forming solders on the solder pads, and parts of the solders being formed in the openings and connected to the connecting pads.

According to the manufacturing method of a semiconductor load board of the present invention, the wider intervals between solder pads are provided, such that the problems of short circuit and electrical interference can be reduced.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
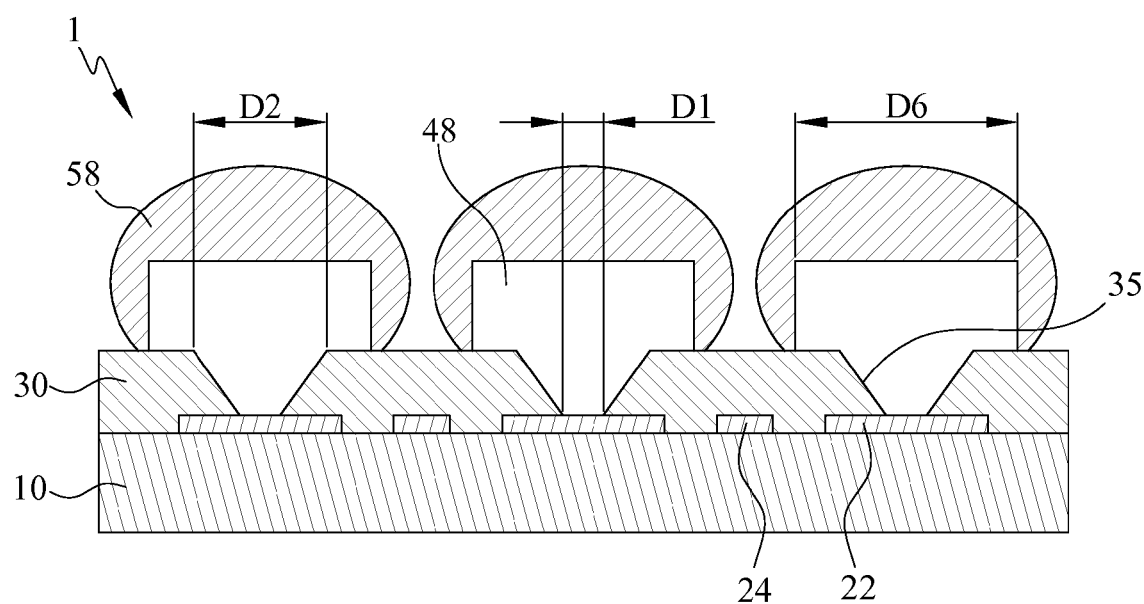
FIG. 1 shows a cross sectional view of a semiconductor load board according to prior arts.
Figure 2:
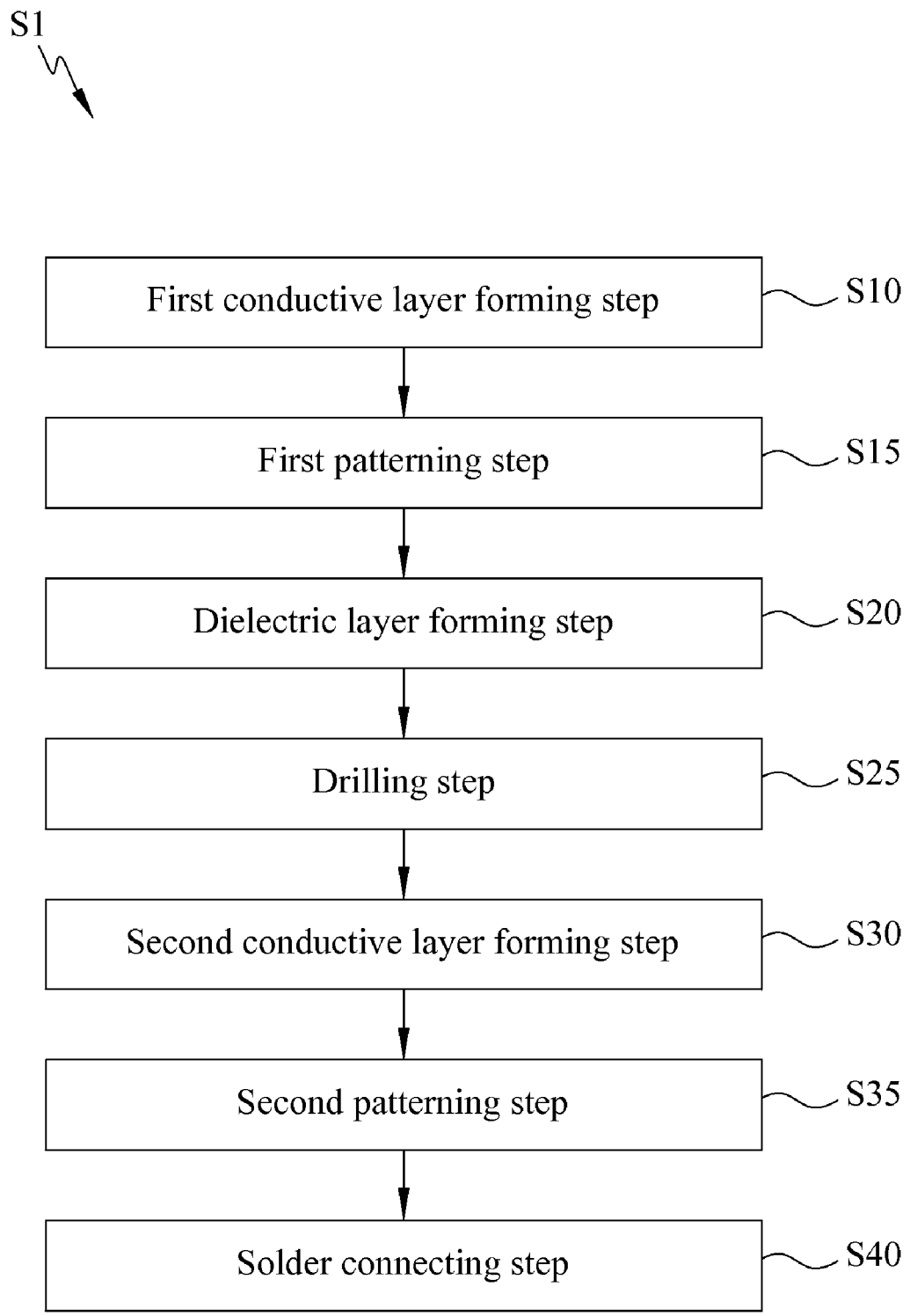
FIG. 2 is a block diagram showing the manufacturing flow of a semiconductor load board according to a first embodiment of the present invention.
Figure 3A:
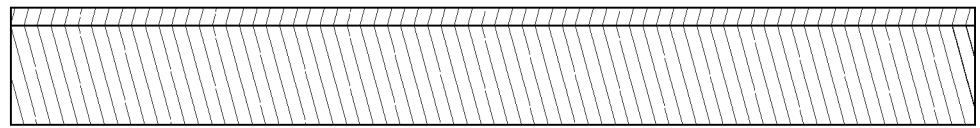
FIG. 3A to FIG. 3G are cross sectional views showing steps of the manufacturing method of a semiconductor load board according to a first embodiment of the present invention.
Figure 3B:
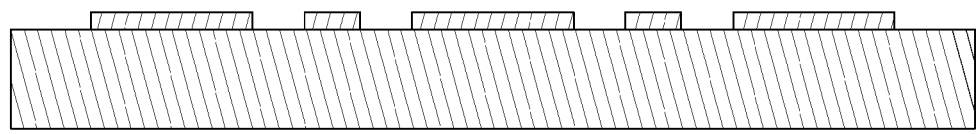
Figure 3C:
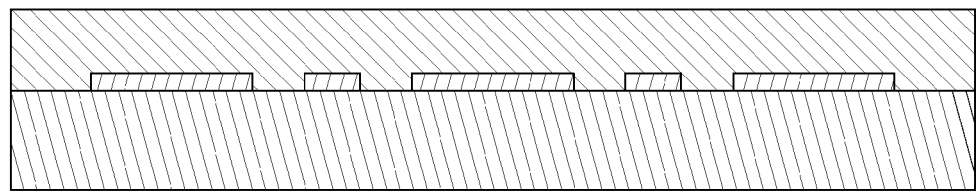
Figure 3D:
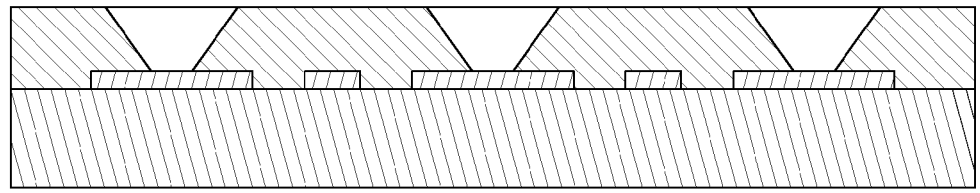

FIG. 2 illustrates the first embodiment of the manufacturing method of a semiconductor load board of the present invention, and FIG. 3A to FIG. 3G show the cross sectional views of steps of the manufacturing method of a semiconductor load board according to the first embodiment of the present invention. As shown in FIG. 2, the manufacturing method S1 comprises a first conductive layer forming step S10, a first patterning step S15, a dielectric layer forming step S20, a drilling step S25, a second conductive layer forming step S30, a second patterning step S35, and a solder connecting step S40. In the first conductive layer forming step S10, a first conductive material is coated on a substrate made of polymer materials or ceramic materials by one of electroplating, electroless plating, evaporation, and sputtering methods, and the first conductive layer is formed as shown in FIG. 3A, wherein the polymer material includes Bismaleimide Triazine (BT). In the first patterning step S15, a first photoresist is formed on the first conductive layer firstly, then the first photoresist is exposed to light using the first pattern photomask, and the exposed first photoresist is then developed using developer solutions to form the first photoresist pattern on the first conductive layer, and the exposed portions of the first conductive layer are etched away by dry etching or wet etching, and finally the first photoresist pattern is removed, and a plurality of connecting pads and a patterned circuit layer are formed, as shown in FIG. 3B. In the dielectric layer forming step S20, a dielectric layer is formed on the substrate, the connection pads, and the patterned circuit layer, as shown in FIG. 3C. In the drilling step S25, a plurality of openings are formed at the positions corresponding to the connection pads by using an alignment laser micro-drilling method, wherein the openings have a width reduced gradually toward the connection pads, as shown in FIG. 3D.

Figure 3E:
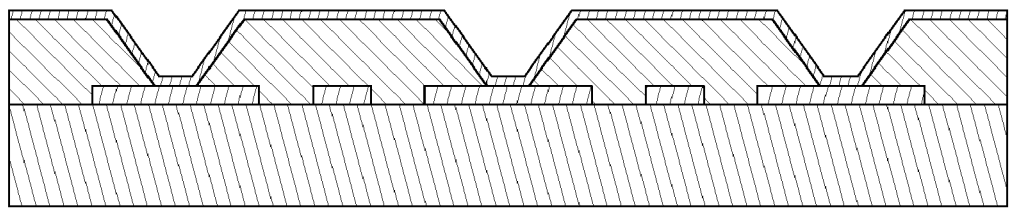
Figure 3F:
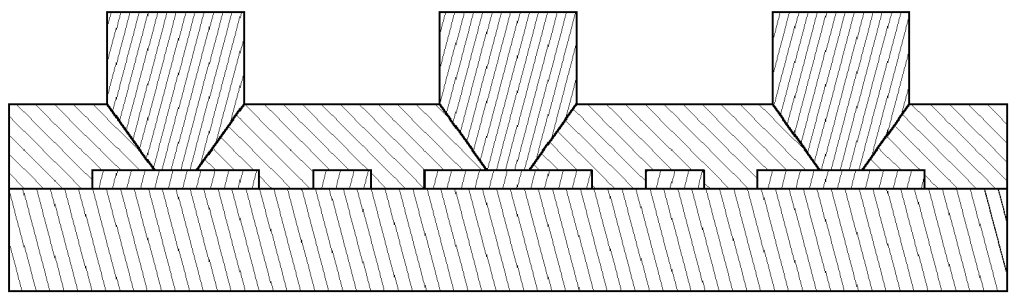
Figure 3G:
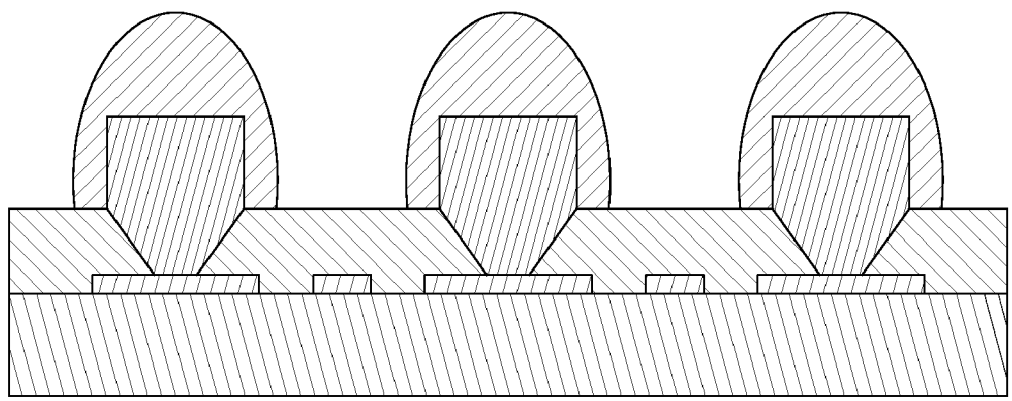

In the second conductive layer forming step S30, a conductive film is formed on the dielectric layer by one of electroplating, electroless plating, evaporation, and sputtering methods, as shown in FIG. 3E. In the second patterning step S35, a second conductive layer made of the same material as the above-mentioned conductive film is formed on the conductive film, and fills the openings. A second photoresist is then formed on the second conductive layer, and subsequently the second photoresist is exposed to light using the second pattern photomask, and the exposed second photoresist is then developed using developer solutions to form the second photoresist pattern, which has a width equal to the maximum width of the openings, on the second conductive layer, and the exposed portions of the second conductive layer are etched away by dry etching or wet etching, and finally the second photoresist pattern is removed to form a plurality of solder pads, wherein the solder pads have a height higher than the height of the dielectric layer, and the width of the portion of each solder pad, which is higher than the dielectric layer, equals to the maximum width of the opening, as shown in FIG. 3F. In the solder connecting step S40, the solders are formed on the solder pads, as shown in FIG. 3G. In the present invention, the first conductive material comprises copper, and second conductive material is copper or copper with nickel-gold or tin coating, and the first and second photoresist are positive photoresist for exemplary description, however, negative photoresist also can be used according to the critical dimension of the photomask.

Figure 4:
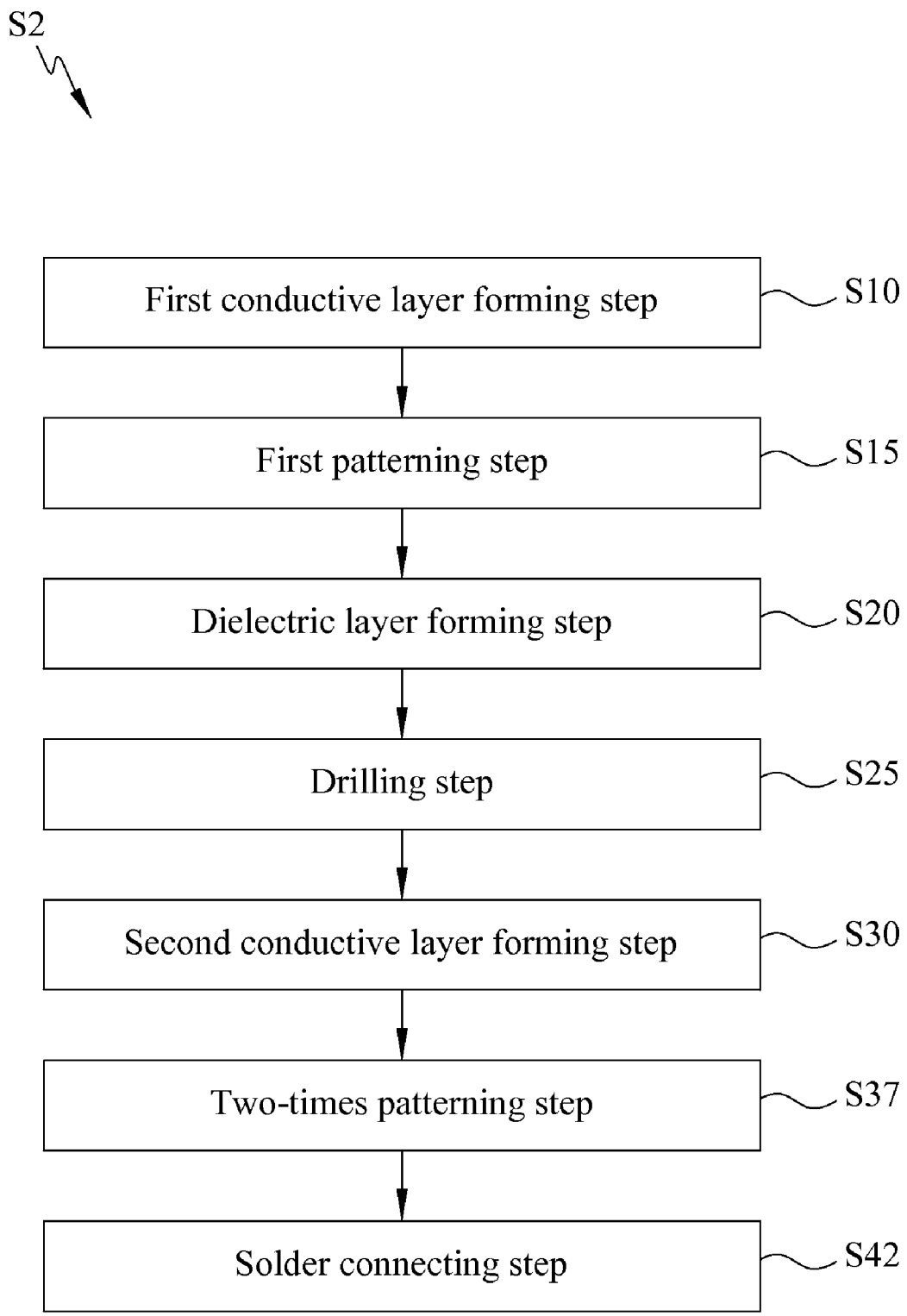
FIG. 4 is a block diagram showing the manufacturing flow of a semiconductor load board according to a second embodiment of the present invention.
Figure 5A:
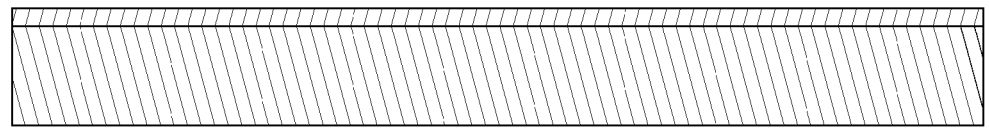
FIG. 5A to FIG. 5G are cross sectional views showing steps of the manufacturing method of a semiconductor load board according to the second embodiment of the present invention.
Figure 5B:
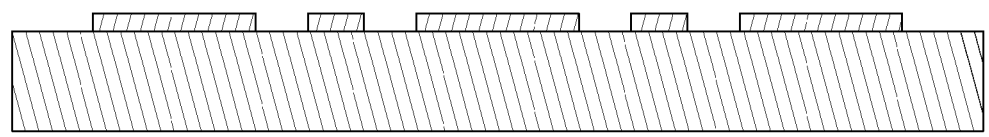
Figure 5C:
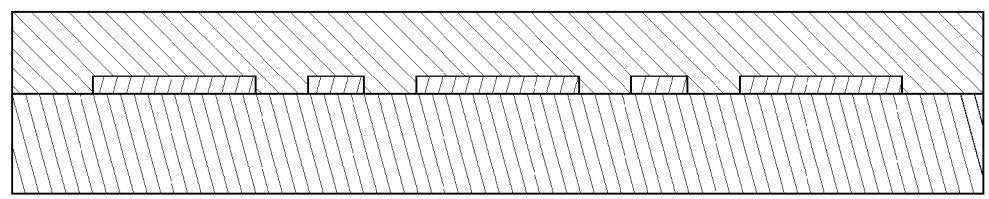
Figure 5D:
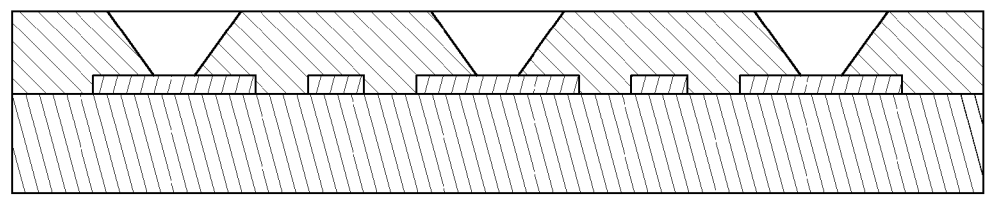
Figure 5E:
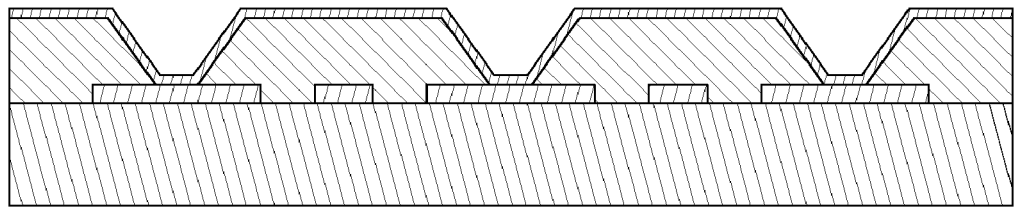
Figure 5F:
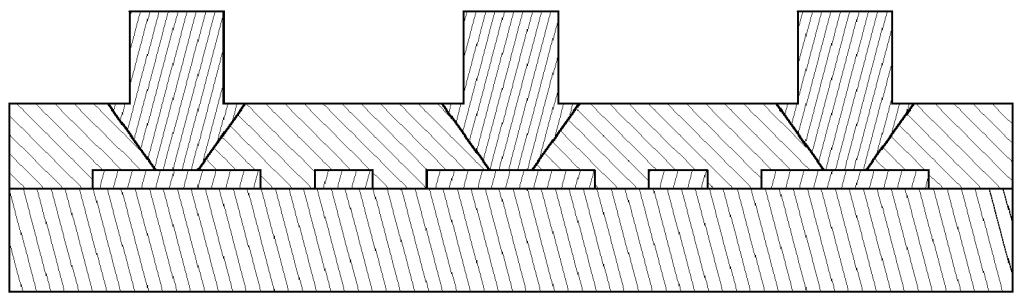
Figure 5G:
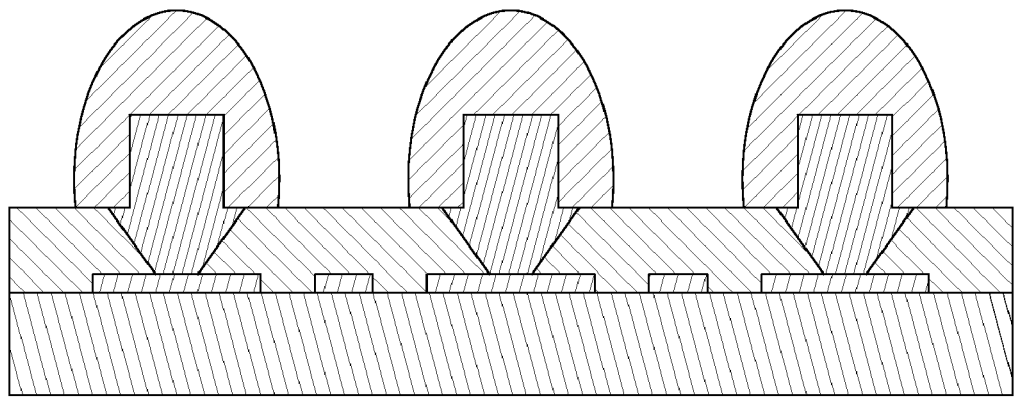

FIG. 4 illustrates the second embodiment of the manufacturing method of a semiconductor load board of the present invention, and FIG. 5A to FIG. 5G show the cross sectional views of steps of the manufacturing method of a semiconductor load board according to the second embodiment of the present invention. As shown in FIG. 4, the manufacturing method S2 is same as the method of first embodiment except for a two-times patterning step S37 and a solder connecting step S42, and the same function and technical characteristics are not described again. In the two-times patterning step S37, a second conductive layer made of the same material as the conductive film is formed on the conductive film, and fills the openings, and then a second photoresist is formed on the second conductive layer, and then the second photoresist is exposed to light using the second pattern photomask, and the exposed second photoresist is then developed using developer solutions to form the second photoresist pattern, which has a width equal to the maximum width of the openings, on the second conductive layer, and the exposed portions of the second conductive layer are etched away by dry etching or wet etching, and finally the second photoresist pattern is removed to form a plurality of solder pads, and subsequently, a third photoresist is formed on the solder pads, then the third photoresist is exposed to light using the third pattern photomask, and the exposed third photoresist is then developed using developer solutions to form the third photoresist pattern, which has a width smaller than the maximum width of the openings, and the exposed portions of the solder pads are etched away by dry etching or wet etching, and finally the third photoresist pattern is removed to form a plurality of protrusion portions of solder pads, wherein each solder pad has a protruding portion which extends above the surface of the dielectric layer, and the width of the protruding portion is smaller than the maximum width of the openings, as shown in FIG. 5F. In the solder connecting step S42, the solders are formed on the solder pads, as shown in FIG. 5G.

Figure 6:
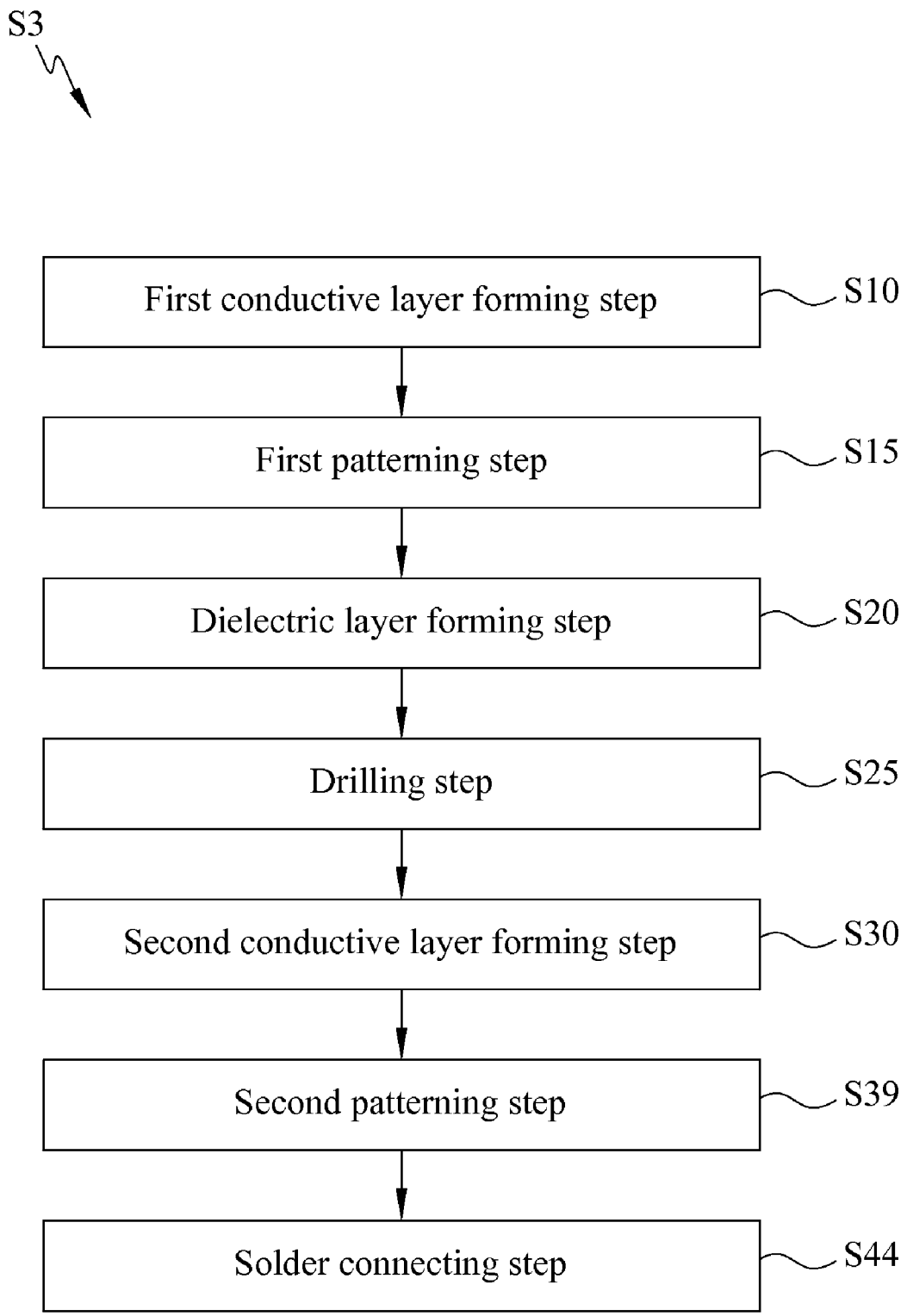
FIG. 6 is a block diagram showing the manufacturing flow of a semiconductor load board according to a third embodiment of the present invention.
Figure 7A:
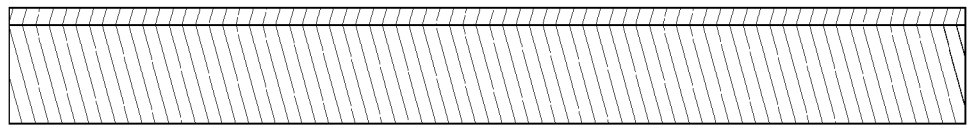
FIG. 7A to FIG. 7G are cross sectional views showing steps of the manufacturing method of a semiconductor load board according to the third embodiment of the present invention.
Figure 7B:
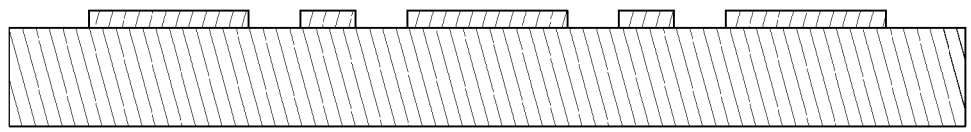
Figure 7C:
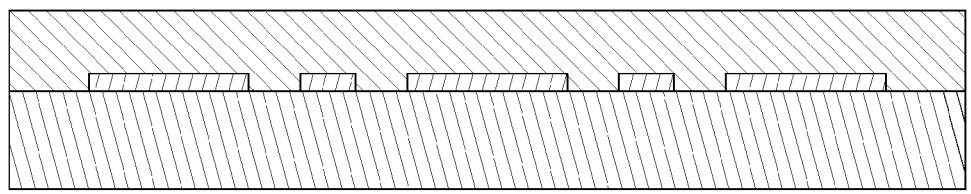
Figure 7D:
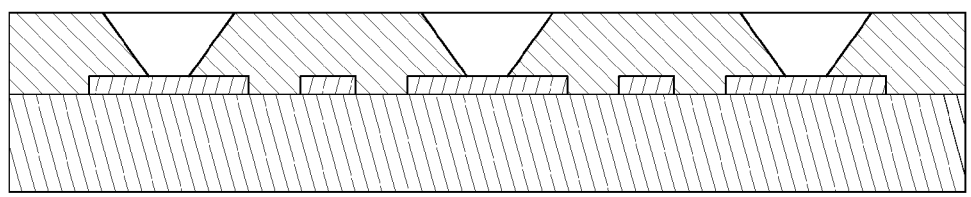
Figure 7E:
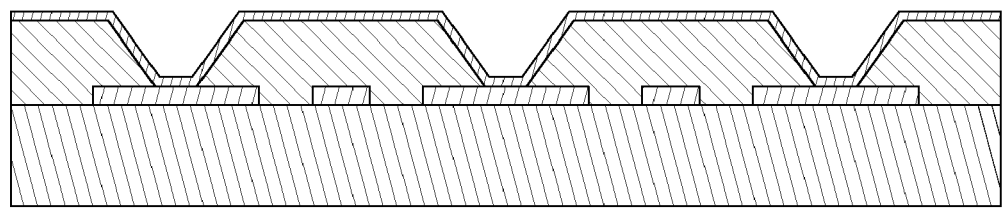
Figure 7F:
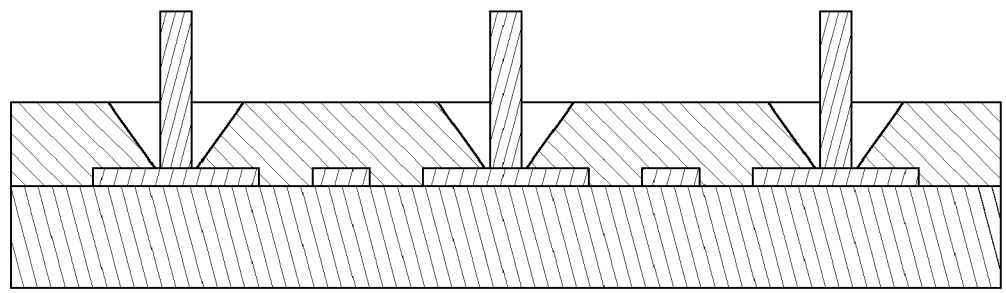
Figure 7G:
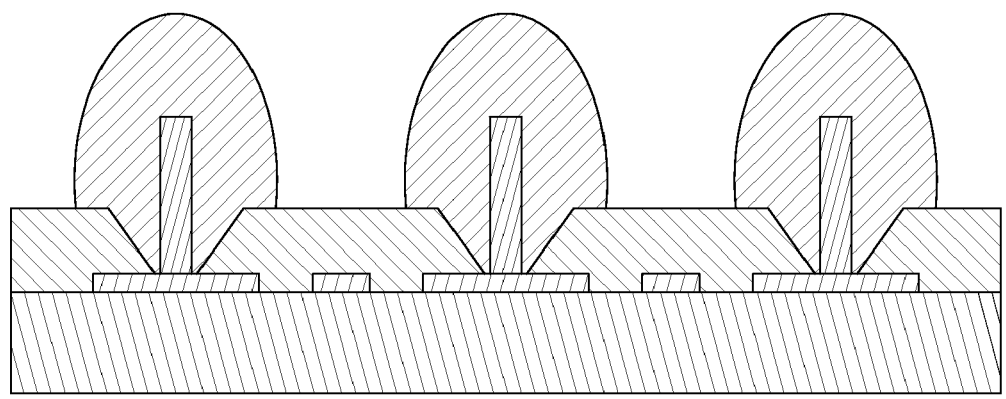

FIG. 6 illustrates the third embodiment of the manufacturing method of a semiconductor load board of the present invention, and FIG. 7A to FIG. 7G show the cross sectional views of steps of the manufacturing method of a semiconductor load board according to the third embodiment of the present invention. The manufacturing method S3 is same as the method of first embodiment except for a second patterning step S39 and a solder connecting step S44, the same function and technical characteristics are not described again. In the second patterning step S39, a second conductive layer made of the same material as the conductive film is formed on the conductive film, and fills the openings, and then a second photoresist is formed on the second conductive layer, and subsequently the second photoresist is exposed to light using the second pattern photomask, and the exposed second photoresist is then developed using developer solutions to form the second photoresist pattern, which has a width equal to the minimum width of the openings, on the second conductive layer, and the exposed portions of the second conductive layer are etched away by dry etching or wet etching, and finally the second photoresist pattern is removed to form a plurality of solder pads, wherein each solder pad has a height higher than the height of the dielectric layer, and the width of the solder pads is smaller than the minimum width of the openings, as shown in FIG. 7F. In the solder connecting step S42, the solders are formed on the solder pads, and parts of the solders are formed in the openings and connected to the connecting pads, as shown in FIG. 7G.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A manufacturing method of a semiconductor load board, comprising:
   coating a first conductive material on a substrate to form a first conductive layer;
   forming a first photoresist on the first conductive layer, exposing the first photoresist to light using a first pattern photomask, developing the exposed first photoresist to form a first photoresist pattern on the first conductive layer, etching the exposed portions of the first conductive layer, removing the first photoresist pattern to form a plurality of connecting pads and a patterned circuit layer;
   forming a dielectric layer on the substrate, the connection pads and the patterned circuit layer;
   forming a plurality of openings at the positions of the dielectric layer corresponding to the connection pads by using an alignment laser micro-drilling method, wherein the opening has a width reduced gradually toward the connection pads;
   forming a conductive film on the dielectric layer;
   forming a second conductive layer made of the same material as the conductive film on the conductive film, the second conductive layer filling the openings;
   forming a second photoresist on the second conductive layer, exposing the second photoresist to light using a second pattern photomask, developing the exposed second photoresist to form a second photoresist pattern having a width equal to a maximum width of the openings on the second conductive layer, etching the exposed portions of the second conductive layer, removing the second photoresist pattern to form a plurality of solder pads, wherein each solder pad has a height higher than a height of the dielectric layer, and a width of a portion of each solder pad, which is higher than the dielectric layer, equals to the maximum width of the opening; and
   forming solders on the solder pads.

2. The method according to claim 1, wherein the substrate is made of at least one of polymer materials or at least one of ceramic materials, and the at least one polymer material comprises Bismaleimide Triazine (BT).

3. The method according to claim 1, wherein the first conductive material comprises copper, and the second conductive material is copper or copper with nickel-gold or tin coating.

4. The method according to claim 1, wherein the first conductive material is coated on the substrate by one of electro-plating, electroless plating, evaporation and sputtering methods.

5. A manufacturing method of a semiconductor load board, comprising:
   coating a first conductive material on a substrate and forming a first conductive layer;
   forming a first photoresist on the first conductive layer, exposing the first photoresist to light using a first pattern photomask, developing the exposed first photoresist to form a first photoresist pattern on the first conductive layer, etching the exposed portions of the first conductive layer, removing the first photoresist pattern to form a plurality of connecting pads and a patterned circuit layer;
   forming a dielectric layer on the substrate, the connection pads and the patterned circuit layer;
   forming a plurality of openings at the positions of the dielectric layer corresponding to the connection pads by using an alignment laser micro-drilling method, wherein the opening has a width reduced gradually toward the connection pads;
   forming a conductive film on the dielectric layer;
   forming a second conductive layer made of the same material as the conductive film on the conductive film, the second conductive layer filling the openings;
   forming a second photoresist on the second conductive layer, exposing the second photoresist to light using a second pattern photomask, developing the exposed second photoresist to form a second photoresist pattern having a width equal to a maximum width of the openings on the second conductive layer, etching the exposed portions of the second conductive layer, removing the second photoresist pattern to form a plurality of solder pads;
   forming a third photoresist on the solder pads, exposing the third photoresist to light using a third pattern photomask, developing the exposed third photoresist to form a third photoresist pattern having a width smaller than a maximum width of the openings on the solder pads, etching the exposed portions of the solder pads, removing the third photoresist pattern to form a plurality of etched solder pads, each of the etched solder pads having a protrusion portion which extends above the surface of the dielectric layer, the protrusion portion having a width smaller than the maximum width of the opening; and forming the solders on the etched solder pads.

6. The method according to claim 5, wherein the substrate is made of at least one of polymer materials or at least one of ceramic materials, and at least one polymer material comprises Bismaleimide Triazine (BT).

7. The method according to claim 5, wherein the first conductive material comprises copper, and the second conductive material is copper or copper with nickel-gold or tin coating.

8. The method according to claim 5, wherein the first conductive material is coated on the substrate by one of electro-plating, electroless plating, evaporation and sputtering methods.

9. A manufacturing method of a semiconductor load board, comprising:

coating a first conductive material on a substrate to form a first conductive layer;

forming a first photoresist on the first conductive layer, exposing the first photoresist to light using a first pattern photomask, developing the exposed first photoresist to form a first photoresist pattern on the first conductive layer, etching the exposed portions of the first conductive layer, removing the first photoresist pattern to form a plurality of connecting pads and a patterned circuit layer, forming a dielectric layer on the substrate, the connection pads and the patterned circuit layer;

forming a plurality of openings at the positions of the dielectric layer corresponding to the connection pads by using an alignment laser micro-drilling method, wherein the opening has a width reduced gradually toward the connection pads;

forming a conductive film on the dielectric layer;

forming a second conductive layer made of the same material as the conductive film on the conductive film, the second conductive layer filling the openings;

forming a second photoresist on the second conductive layer, exposing the second photoresist to light using a second pattern photomask, developing the exposed second photoresist to form a second photoresist pattern having a width equal to a minimum width of the openings on the second conductive layer, etching the exposed portions of the second conductive layer, removing the second photoresist pattern to form a plurality of solder pads, wherein each solder pad has a height higher than a height of the dielectric layer, and the width of each solder pad is smaller than the minimum width of the opening; and forming solders on the solder pads, and parts of the solders being formed in the openings and connected to the connecting pads.

10. The method according to claim 9, wherein the substrate is made of at least one of polymer materials or at least one of ceramic materials, and the at least one polymer material comprises Bismaleimide Triazine (BT).

11. The method according to claim 9, wherein the first conductive material comprises copper, and the second conductive material is copper or copper with nickel-gold or tin coating.

12. The method according to claim 9, wherein the first conductive material is coated on the substrate by one of electro-plating, electroless plating, evaporation and sputtering methods.

* * * * *